(12) United States Patent
Kim

(10) Patent No.: US 8,779,845 B2
(45) Date of Patent: Jul. 15, 2014

(54) SEMICONDUCTOR APPARATUS

(75) Inventor: Jong Hwan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/604,500

(22) Filed: Sep. 5, 2012

(65) Prior Publication Data

US 2013/0285718 A1    Oct. 31, 2013

(30) Foreign Application Priority Data

Apr. 25, 2012  (KR) .................. 10-2012-0043253

(51) Int. Cl.
*G05G 1/00*  (2008.04)
*G05F 3/02*  (2006.01)

(52) U.S. Cl.
USPC ............ 327/536; 327/537; 327/540; 327/541

(58) Field of Classification Search
USPC ................................................ 327/536, 537
See application file for complete search history.

(56) References Cited

U.S. PATENT DOCUMENTS 7,348,828 B2 *   3/2008   Lee et al. ................... 327/536
7,427,889 B2 *   9/2008   Lin et al. ................... 327/536

FOREIGN PATENT DOCUMENTS

KR    10-2009-0074485 A    7/2009

* cited by examiner

*Primary Examiner* — John Poos
(74) *Attorney, Agent, or Firm* — William Park & Associates Patent Ltd.

(57) ABSTRACT

A semiconductor apparatus includes a control unit configured to generate a first pumping enable signal and a second pumping enable signal which are alternately enabled, in response to an active signal; a first pumping voltage generation unit configured to perform a pumping operation during an enable period of the first pumping enable signal and generate a first pumping voltage; and a second pumping voltage generation unit configured to perform a pumping operation during an enable period of the second pumping enable signal and generate a second pumping voltage.

19 Claims, 5 Drawing Sheets

SEMICONDUCTOR APPARATUS

CROSS-REFERENCES TO RELATED APPLICATION

The present application claims priority under 35 U.S.C. §119(a) to Korean application number 10-2012-0043253, filed on Apr. 25, 2012, in the Korean Intellectual Property Office, which is incorporated by reference herein in its entirety.

BACKGROUND

1. Technical Field

The present invention relates to a semiconductor integrated circuit, and more particularly, to a semiconductor apparatus.

2. Related Art

A semiconductor apparatus operates by receiving a voltage from a source outside the semiconductor apparatus. The voltage received from the outside, that is, an external voltage may be used by being converted into a voltage level that is needed internally by the semiconductor apparatus. This voltage is referred to as an internal voltage.

A semiconductor apparatus generates not only a voltage with a level higher than the level of an external voltage, but also a voltage with a level lower than the level of a ground voltage. In general, the voltage with the level higher than the level of the external voltage and the voltage with the level lower than the level of the ground voltage are referred to as pumping voltages. The voltage with the level higher than the level of the external voltage is referred to as a positive pumping voltage, and the voltage with the level lower than the level of the ground voltage is referred to as a negative pumping voltage.

Referring to FIG. 1, a conventional semiconductor apparatus 40 includes a first pumping voltage generation unit 10, a second pumping voltage generation unit 20, and a word line driver 30.

The first pumping voltage generation unit 10 generates a first pumping voltage VPP when an active signal ACT is enabled. The first pumping voltage VPP is a positive pumping voltage.

The second pumping voltage generation unit 20 generates a second pumping voltage VBB when the active signal ACT is enabled. The second pumping voltage VBB is a negative pumping voltage.

The word line driver 30 is applied with the first pumping voltage VPP and the second pumping voltage VBB as driving voltages, and drives a word line (not shown).

As the degree of integration of the semiconductor apparatus 40 increases, the current driving forces of the first pumping voltage generation unit 10 and the second pumping voltage generation unit 20 have been augmented.

Thus, in opposition to a recent trend for reducing current consumption, the magnitude of current consumed to generate pumping voltages increases. Further, since the first pumping voltage generation unit 10 and the second pumping voltage generation unit 20 simultaneously operate based on the active signal ACT, peak current is raised and power noise is generated.

SUMMARY

In one embodiment of the present invention, a semiconductor apparatus includes: a control unit configured to generate a first pumping enable signal and a second pumping enable signal which are alternately enabled, in response to an active signal; a first pumping voltage generation unit configured to perform a pumping operation during an enable period of the first pumping enable signal and generate a first pumping voltage; and a second pumping voltage generation unit configured to perform a pumping operation during an enable period of the second pumping enable signal and generate a second pumping voltage.

In another embodiment of the present invention, a semiconductor apparatus includes: a first sensing section configured to sense a level of a first pumping voltage and generate a first oscillator enable signal; a first oscillator configured to generate a first oscillator signal in response to the first oscillator enable signal; a first standby pumping section configured to perform a pumping operation in response to the first oscillator signal and generate the first pumping voltage; a control unit configured to generate a first pumping enable signal and a second pumping enable signal which are alternately enabled, in response to an active signal; a first pumping control section configured to output the first oscillator signal as a first active oscillator signal during an enable period of the first pumping enable signal; a first active pumping section configured to perform a pumping operation in response to the first active oscillator signal and generate the first pumping voltage; a second sensing section configured to sense a level of a second pumping voltage and generate a second oscillator enable signal; a second oscillator configured to generate a second oscillator signal in response to the second oscillator enable signal; a second standby pumping section configured to perform a pumping operation in response to the second oscillator signal and generate the second pumping voltage; a second pumping control section configured to output the second oscillator signal as a second active oscillator signal during an enable period of the second pumping enable signal; and a second active pumping section configured to perform a pumping operation in response to the second active oscillator signal and generate the second pumping voltage.

In another embodiment of the present invention, a semiconductor apparatus includes: a control unit configured to generate a first pumping enable signal and a second pumping enable signal which are alternately enabled, in response to an active signal in a refresh operation; a first pumping voltage generation unit configured to perform a pumping operation in response to the active signal and the first pumping enable signal and generate a first pumping voltage; and a second pumping voltage generation unit configured to perform a pumping operation in response to the active signal and the second pumping enable signal and generate a second pumping voltage.

In still another embodiment of the present invention, a semiconductor apparatus includes, a control unit configured to generate a first pumping enable signal and a second pumping enable signal which are alternately enabled, in response to an active signal in a refresh operation; a first pumping voltage generation unit configured to perform a pumping operation in response to the active signal and the first pumping enable signal and generate a first pumping voltage; and a second pumping voltage generation unit configured to perform a pumping operation in response to the active signal and the second pumping enable signal and generate a second pumping voltage, wherein, in the refresh operation, the first pumping voltage generation unit and the second pumping voltage generation unit alternately perform the pumping operations, and wherein, in a non-refresh operation, the first pumping voltage generation unit and the second pumping voltage generation unit simultaneously perform the pumping operations.

In another embodiment of the present invention, a semiconductor apparatus includes: a first sensing section configured to sense a level of a first pumping voltage and generate a first oscillator enable signal; a first oscillator configured to generate a first oscillator signal in response to the first oscillator enable signal; a first standby pumping section configured to perform a pumping operation in response to the first oscillator signal and generate the first pumping voltage; a control unit configured to generate a first pumping enable signal and a second pumping enable signal which are alternately enabled, in response to an active signal in a refresh operation; a first pumping control section configured to output the first oscillator signal as a first active oscillator signal when both the first pumping enable signal and the active signal are enabled; a first active pumping section configured to perform a pumping operation in response to the first active oscillator signal and generate the first pumping voltage; a second sensing section configured to sense a level of a second pumping voltage and generate a second oscillator enable signal; a second oscillator configured to generate a second oscillator signal in response to the second oscillator enable signal; a second standby pumping section configured to perform a pumping operation in response to the second oscillator signal and generate the second pumping voltage; a second pumping control section configured to output the second oscillator signal as a second active oscillator signal when both the second pumping enable signal and the active signal are enabled; and a second active pumping section configured to perform a pumping operation in response to the second active oscillator signal and generate the second pumping voltage.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through example embodiments.

Figure 1:
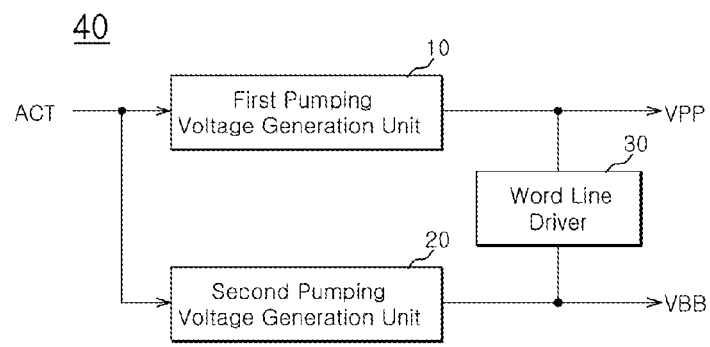
FIG. 1 is a configuration diagram of a conventional semiconductor apparatus.
Figure 2:
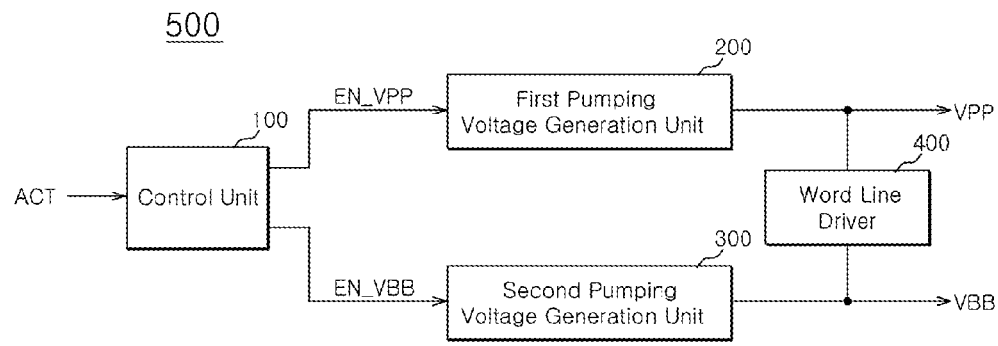
FIG. 2 is a configuration diagram of a semiconductor apparatus in accordance with an embodiment of the present invention.

Referring to FIG. 2, a semiconductor apparatus 500 in accordance with an embodiment of the present invention includes a control unit 100, a first pumping voltage generation unit 200, a second pumping voltage generation unit 300, and a word line driver 400.

The control unit 100 is configured to generate a first pumping enable signal EN_VPP and a second pumping enable signal EN_VBB which are alternately enabled in response to an active signal ACT. For example, the control unit 100 generates the first pumping enable signal EN_VPP and the second pumping enable signal EN_VBB with a phase opposite to the first pumping enable signal EN_VPP, which are repeatedly enabled and disabled at times when the active signal ACT is enabled. That is to say, the control unit 100 generates the first pumping enable signal EN_VPP by dividing the active signal ACT, and generates the second pumping enable signal EN_VBB by inverting the first pumping enable signal EN_VPP.

The first pumping voltage generation unit 200 is configured to perform a pumping operation during the enable period of the first pumping enable signal EN_VPP and generate a first pumping voltage VPP. The first pumping voltage VPP has a voltage level higher than that of an external voltage, and may be referred to as a positive pumping voltage.

The second pumping voltage generation unit 300 is configured to perform a pumping operation during the enable period of the second pumping enable signal EN_VBB and generate a second pumping voltage VBB. The second pumping voltage VBB has a voltage level lower than that of a ground voltage, and may be referred to as a negative pumping voltage.

The word line driver 400 is configured to be applied with the first and second pumping voltages VPP and VBB as driving voltages and drive a word line (not shown).

Figure 3:
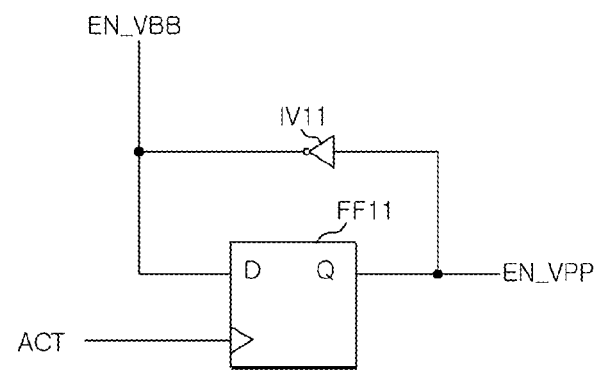
FIG. 3 is a configuration diagram of a control unit of FIG. 2.

Referring to FIG. 3, the control unit 100 includes a flip-flop FF11 and a first inverter IV11. The flip-flop FF11 is inputted with the active signal ACT through a clock input terminal thereof. The first inverter IV11 has an input terminal to which an output terminal Q of the flip-flop FF11 is connected, and an output terminal to which an input terminal D of the flip-flop FF11 is connected. The signal outputted from the output terminal Q of the flip-flop FF11 is the first pumping enable signal EN_VPP, and the output signal of the first inverter IV11 is the second pumping enable signal EN_VBB.

Figure 4:
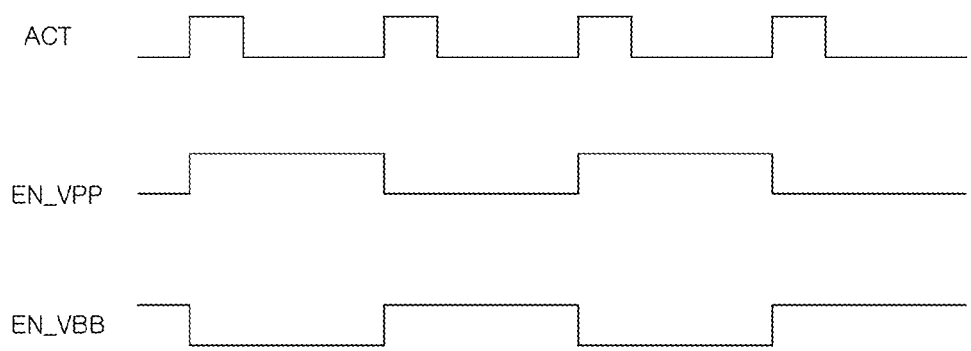
FIG. 4 is a timing diagram of the control unit of FIG. 2.

Referring to FIG. 4, the first and second pumping enable signals EN_VPP and EN_VBB are alternately and repeatedly enabled and disabled at times when the active signal ACT is enabled to a high level. Further, the first and second pumping enable signals EN_VPP and EN_VBB may be enabled and disabled to opposite levels. Thus, for example, when the active signal ACT is enabled at a first time, the first pumping enable signal EN_VPP may transition from a low level to a high level, and the second pumping enable signal EN_VBB may transition from a high level to a low level. At a second time when the active signal ACT is enabled, the first pumping enable signal EN_VPP may transition from a high level to a low level, and the second pumping enable signal EN_VBB may transition from a low level to a high level.

The semiconductor apparatus in accordance with an embodiment of the present invention, configured as mentioned above, alternately performs pumping operations for generating the first pumping voltage VPP and the second pumping voltage VBB at times when the active signal ACT is enabled. Accordingly, in the semiconductor apparatus in accordance with the embodiment of the present invention, since the pumping operations for generating the first pumping voltage VPP and the second pumping voltage VBB are alternately performed, peak current may be decreased.

Figure 5:
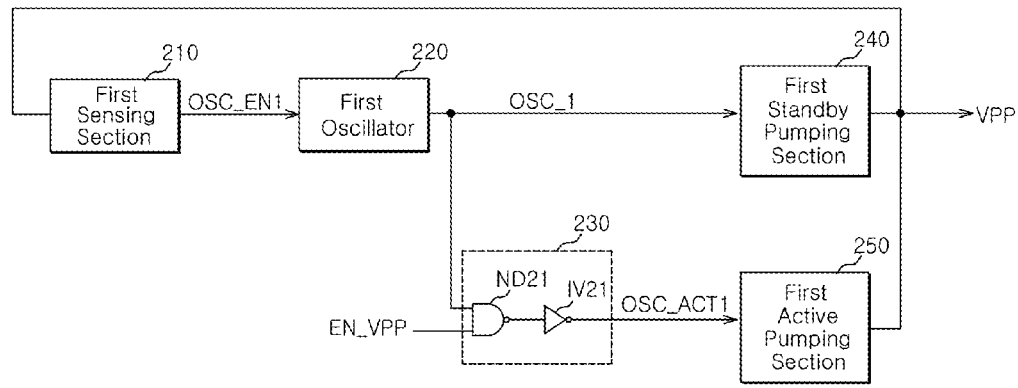
FIG. 5 is a configuration diagram of a first pumping voltage generation unit of FIG. 2.

Referring to FIG. 5, the first pumping voltage generation unit 200 of the semiconductor apparatus in accordance with the embodiment of the present invention shown in FIG. 2 may include a first sensing section 210, a first oscillator 220, a first pumping control section 230, a first standby pumping section 240, and a first active pumping section 250.

The first sensing section 210 is configured to sense the level of the first pumping voltage VPP and generate a first oscillator enable signal OSC_EN1. For example, the first sensing section 210 enables the first oscillator enable signal OSC_EN1 when the level of the first pumping voltage VPP is lower than a target level.

The first oscillator 220 is configured to generate a first oscillator signal OSC_1 in response to the first oscillator enable signal OSC_EN1. For example, the first oscillator 220 generates the first oscillator signal OSC_1 which is enabled with a preset cycle when the first oscillator enable signal OSC_EN1 is enabled.

The first pumping control section 230 is configured to output the first oscillator signal OSC_1 as a first active oscillator signal OSC_ACT1 when the first pumping enable signal EN_VPP is enabled. For example, the first pumping control section 230 is configured to output the first oscillator signal OSC_1 as the first active oscillator signal OSC_ACT1 when the first pumping enable signal EN_VPP is enabled to a high level. The first pumping control section 230 includes a first NAND gate ND21 and a second inverter IV21. The first NAND gate ND21 receives the first oscillator signal OSC_1 and the first pumping enable signal EN_VPP. The second inverter IV21 receives the output signal of the first NAND gate ND21 and outputs the first active oscillator signal OSC_ACT1.

The first standby pumping section 240 is configured to perform a pumping operation in response to the first oscillator signal OSC_1 and generate the first pumping voltage VPP.

The first active pumping section 250 is configured to perform a pumping operation in response to the first active oscillator signal OSC_ACT1 and generate the first pumping voltage VPP. The output terminals of the first standby pumping section 240 and the first active pumping section 250 are commonly connected with each other at a node, and the voltage of the commonly connected node is the first pumping voltage VPP.

Figure 6:
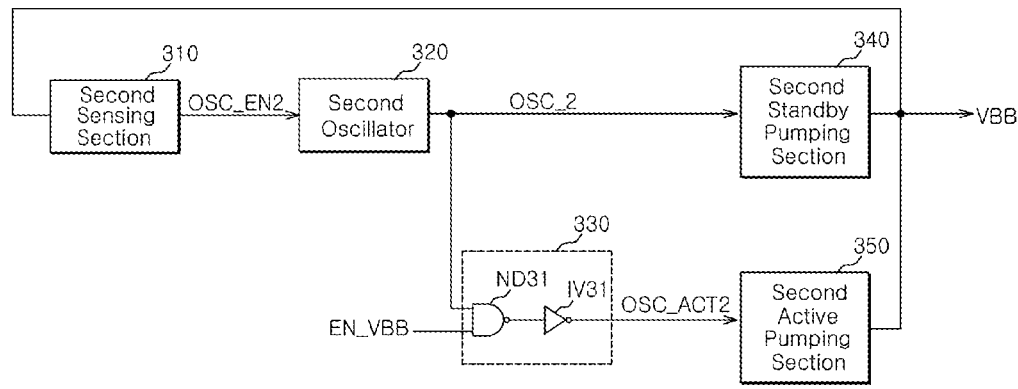
FIG. 6 is a configuration diagram of a second pumping voltage generation unit of FIG. 2.

Referring to FIG. 6, the second pumping voltage generation unit 300 of the semiconductor apparatus in accordance with an embodiment of the present invention shown in FIG. 2 may include a second sensing section 310, a second oscillator 320, a second pumping control section 330, a second standby pumping section 340, and a second active pumping section 350.

The second sensing section 310 is configured to sense the level of the second pumping voltage VBB and generate a second oscillator enable signal OSC_EN2. For example, the second sensing section 310 enables the second oscillator enable signal OSC_EN2 when the level of the second pumping voltage VBB is higher than a target level.

The second oscillator 320 is configured to generate a second oscillator signal OSC_2 in response to the second oscillator enable signal OSC_EN2. For example, the second oscillator 320 generates the second oscillator signal OSC_2 which is enabled with a preset cycle when the second oscillator enable signal OSC_EN2 is enabled.

The second pumping control section 330 is configured to output the second oscillator signal OSC_2 as a second active oscillator signal OSC_ACT2 when the second pumping enable signal EN_VBB is enabled. For example, the second pumping control section 330 is configured to output the second oscillator signal OSC_2 as the second active oscillator signal OSC_ACT2 when the second pumping enable signal EN_VBB is enabled to a high level. The second pumping control section 330 includes a second NAND gate ND31 and a third inverter IV31. The second NAND gate ND31 receives the second oscillator signal OSC_2 and the second pumping enable signal EN_VBB. The third inverter IV31 receives the output signal of the second NAND gate ND31 and outputs the second active oscillator signal OSC_ACT2.

The second standby pumping section 340 is configured to perform a pumping operation in response to the second oscillator signal OSC_2 and generate the second pumping voltage VBB.

The second active pumping section 350 is configured to perform a pumping operation in response to the second active oscillator signal OSC_ACT2 and generate the second pumping voltage VBB. The output terminals of the second standby pumping section 340 and the second active pumping section 350 are commonly connected with each other at a node, and the voltage of the commonly connected node is the second pumping voltage VBB.

The first and second pumping voltage generation units 200 and 300 shown in FIGS. 5 and 6 represent embodiments in which the first and second standby pumping sections 240 and 340 are separated from the first and second active pumping sections 250 and 350. In the semiconductor apparatus including the first and second pumping voltage generation units 200 and 300 configured as shown in FIGS. 5 and 6, the first and second standby pumping sections 240 and 340 perform pumping operations regardless of the state active signal ACT. Also, the first and second active pumping sections 250 and 350 alternately perform pumping operations according to the first and second pumping enable signals EN_VPP and EN_VBB which are alternately enabled according to the active signal ACT. The first and second pumping voltage generation units 200 and 300 may be configured such that the pump number of the first and second active pumping sections 250 and 350 is larger than the pump number of the first and second standby pumping sections 240 and 340. Therefore, in the embodiment of the present invention, because the pumping operations of the first and second active pumping sections 250 and 350 which operate according to the active signal ACT are alternately performed, current consumed to generate the first and second pumping voltages VPP and VBB may be reduced and the peak current may be decreased.

Figure 7:
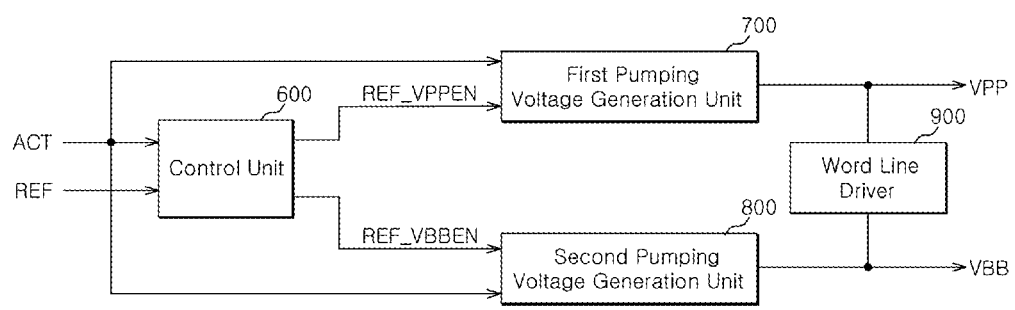
FIG. 7 is a configuration diagram of a semiconductor apparatus in accordance with another embodiment of the present invention.

Referring to FIG. 7, a semiconductor apparatus 1000 in accordance with another embodiment of the present invention includes a control unit 600, a first pumping voltage generation unit 700, a second pumping voltage generation unit 800, and a word line driver 900.

The control unit 600 is configured to generate a first pumping enable signal REF_VPPEN and a second pumping enable signal REF_VBBEN which are alternately enabled in response to an active signal ACT in a refresh operation. For example, the control unit 600 generates the first pumping enable signal REF_VPPEN by dividing the active signal ACT during the enable period of a refresh signal REF, and generates the second pumping enable signal REF_VBBEN by inverting the first pumping enable signal REF_VPPEN. Also, the control unit 600 enables both the first and second pumping enable signals REF_VPPEN and REF_VBBEN when the refresh signal REF is disabled.

The first pumping voltage generation unit 700 is configured to perform a pumping operation in response to the active signal ACT and the first pumping enable signal REF_VPPEN and generate a first pumping voltage VPP. For example, the first pumping voltage generation unit 700 performs the pumping operation when both the active signal ACT and the first pumping enable signal REF_VPPEN are enabled.

The second pumping voltage generation unit 800 is configured to perform a pumping operation in response to the active signal ACT and the second pumping enable signal REF_VBBEN and generate a second pumping voltage VBB.

For example, the second pumping voltage generation unit 800 performs the pumping operation when both the active signal ACT and the second pumping enable signal REF_VBBEN are enabled.

The first pumping voltage VPP and the second pumping voltage VBB have different levels. The first pumping voltage VPP has a voltage level that is higher than the level of an external voltage which is received by the semiconductor apparatus from an outside, and the second pumping voltage VBB has a voltage level that is lower than the level of a ground voltage.

The word line driver 900 is configured to be applied with the first and second pumping voltages VPP and VBB as driving voltages and drive a word line (not shown).

Figure 8:
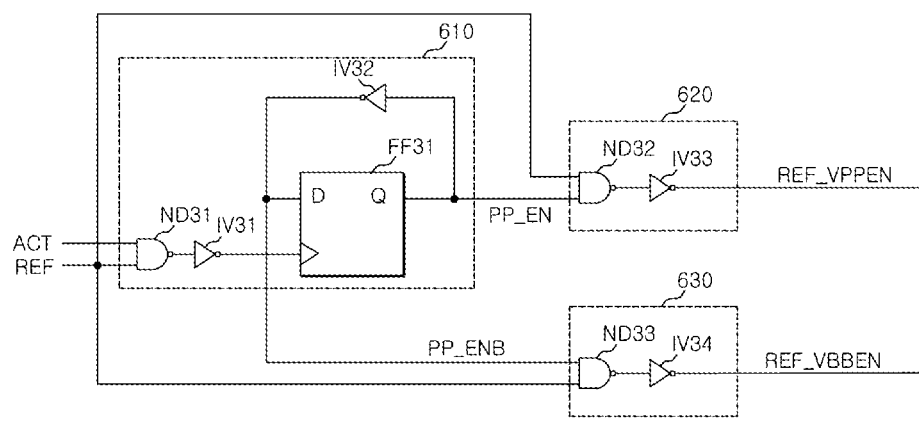
FIG. 8 is a configuration diagram of a control unit of FIG. 7.

Referring to FIG. 8, the control unit 600 includes a dividing section 610, a first signal output section 620, and a second signal output section 630.

The dividing section 610 is configured to generate a first enable signal PP_EN by dividing the active signal ACT when the refresh signal REF is enabled, and generate a second enable signal PP_ENB by inverting the first enable signal PP_EN. That is to say, the dividing section 610 generates the first enable signal PP_EN, which is repeatedly enabled and disabled at times when the active signal ACT is enabled, if the refresh signal REF is enabled. The dividing section 610 outputs the second enable signal PP_ENB by inverting the first enable signal PP_EN.

The dividing section 610 includes a first NAND gate ND31, first and second inverters IV31 and IV32, and a flip-flop FF31. The first NAND gate ND31 is inputted with the refresh signal REF and the active signal ACT. The first inverter IV31 is inputted with the output signal of the first NAND gate ND31. The flip-flop FF31 is inputted with the output signal of the first inverter IV31 through a clock input terminal thereof. The second inverter IV32 has an input terminal to which an output terminal Q of the flip-flop FF31 is connected and an output terminal which is connected to an input terminal D of the flip-flop FF31. The first enable signal PP_EN is outputted from the output terminal Q of the flip-flop FF31, and the second enable signal PP_ENB is the output signal of the second inverter IV32.

The first signal output section 620 is configured to output the first enable signal PP_EN as the first pumping enable signal REF_VPPEN when the refresh signal REF is enabled, and enable the first pumping enable signal REF_VPPEN when the refresh signal REF is disabled regardless of the first enable signal PP_EN.

The first signal output section 620 includes a second NAND gate ND32 and a third inverter IV33. The second NAND gate ND32 is inputted with the first enable signal PP_EN and the refresh signal REF. The third inverter IV33 is inputted with the output signal of the second NAND gate ND32 and outputs the first pumping enable signal REF_VPPEN.

The second signal output section 630 is configured to output the second enable signal PP_ENB as the second pumping enable signal REF_VBBEN when the refresh signal REF is enabled, and enable the second pumping enable signal REF_VBBEN when the refresh signal REF is disabled regardless of the second enable signal PP_ENB.

The second signal output section 630 includes a third NAND gate ND33 and a fourth inverter IV34. The third NAND gate ND33 is inputted with the second enable signal PP_ENB and the refresh signal REF. The fourth inverter IV34 is inputted with the output signal of the third NAND gate ND33 and outputs the second pumping enable signal REF_VBBEN.

The semiconductor apparatus 1000 in accordance with another embodiment of the present invention, configured as mentioned above, alternately enables the first and second pumping enable signals REF_VPPEN and REF_VBBEN at times when the active signal ACT is enabled in the refresh operation. If both the active signal ACT and the first pumping enable signal REF_VPPEN are enabled in the refresh operation, the first pumping voltage generation unit 700 performs a pumping operation and generates the first pumping voltage VPP. If both the active signal ACT and the second pumping enable signal REF_VBBEN are enabled, the second pumping voltage generation unit 800 performs a pumping operation and generates the second pumping voltage VBB. Further, in a non-refresh operation, that is, with the refresh signal REF disabled, since both the first and second pumping enable signals REF_VPPEN and REF_VBBEN are enabled, if the active signal ACT is enabled, the first and second pumping voltage generation units 700 and 800 simultaneously perform the pumping operations and generate the first and second pumping voltages VPP and VBB.

In this way, in the present embodiment of the invention, since the semiconductor apparatus is configured such that the pumping operations for generating the pumping voltages with different levels in the refresh operation are alternately performed, peak current may be decreased in the refresh operation.

Figure 9:
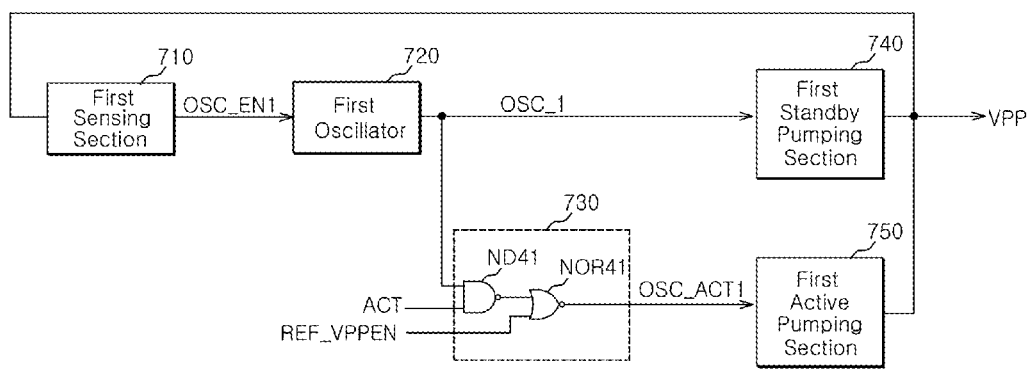
FIG. 9 is a configuration diagram of a first pumping voltage generation unit of FIG. 7.

Referring to FIG. 9, the first pumping voltage generation unit 700 of the semiconductor apparatus 1000 in accordance with another embodiment of the present invention shown in FIG. 7 may include a first sensing section 710, a first oscillator 720, a first pumping control section 730, a first standby pumping section 740, and a first active pumping section 750.

The first sensing section 710 is configured to sense the level of the first pumping voltage VPP and generate a first oscillator enable signal OSC_EN1. For example, the first sensing section 710 enables the first oscillator enable signal OSC_EN1 when the level of the first pumping voltage VPP is lower than a target level.

The first oscillator 720 is configured to generate a first oscillator signal OSC_1 in response to the first oscillator enable signal OSC_EN1. For example, the first oscillator 720 generates the first oscillator signal OSC_1 which is enabled with a preset cycle when the first oscillator enable signal OSC_EN1 is enabled.

The first pumping control section 730 is configured to output the first oscillator signal OSC_1 as a first active oscillator signal OSC_ACT1 when the active signal ACT and the first pumping enable signal REF_VPPEN are enabled. For example, the first pumping control section 730 is configured to output the first oscillator signal OSC_1 as the first active oscillator signal OSC_ACT1 when the active signal ACT is enabled to a high level and the first pumping enable signal REF_VPPEN is enabled to a low level. The first pumping control section 730 includes a fourth NAND gate ND41 and a first NOR gate NOR41. The fourth NAND gate ND41 receives the first oscillator signal OSC_1 and the active signal ACT. The first NOR gate NOR41 receives the output signal of the fourth NAND gate ND41 and the first pumping enable signal REF_VPPEN and outputs the first active oscillator signal OSC_ACT1.

The first standby pumping section 740 is configured to perform a pumping operation in response to the first oscillator signal OSC_1 and generate the first pumping voltage VPP.

The first active pumping section 750 is configured to perform a pumping operation in response to the first active oscillator signal OSC_ACT1 and generate the first pumping voltage VPP. The output terminals of the first standby pumping section 740 and the first active pumping section 750 are commonly connected with each other at a node, and the voltage of the commonly connected node is the first pumping voltage VPP.

Figure 10:
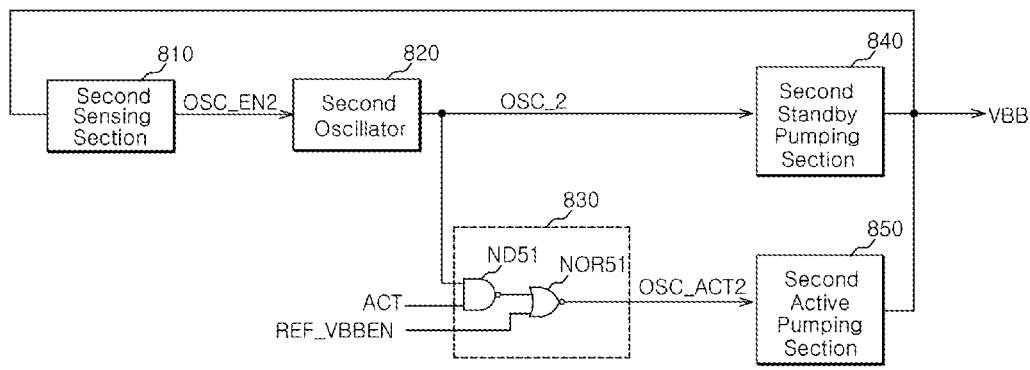
FIG. 10 is a configuration diagram of a second pumping voltage generation unit of FIG. 7.

Referring to FIG. 10, the second pumping voltage generation unit 800 of the semiconductor apparatus 1000 in accordance with another embodiment of the present invention shown in FIG. 7 may include a second sensing section 810, a second oscillator 820, a second pumping control section 830, a second standby pumping section 840, and a second active pumping section 850.

The second sensing section 810 is configured to sense the level of the second pumping voltage VBB and generate a second oscillator enable signal OSC_EN2. For example, the second sensing section 810 enables the second oscillator enable signal OSC_EN2 when the level of the second pumping voltage VBB is higher than a target level.

The second oscillator 820 is configured to generate a second oscillator signal OSC_2 in response to the second oscillator enable signal OSC_EN2. For example, the second oscillator 820 generates the second oscillator signal OSC_2 which is enabled with a preset cycle when the second oscillator enable signal OSC_EN2 is enabled.

The second pumping control section 830 is configured to output the second oscillator signal OSC_2 as a second active oscillator signal OSC_ACT2 when the active signal ACT and the second pumping enable signal REF_VBBEN are enabled. For example, the second pumping control section 830 is configured to output the second oscillator signal OSC_2 as the second active oscillator signal OSC_ACT2 when the active signal ACT is enabled to the high level and the second pumping enable signal REF_VBBEN is enabled to a low level. The second pumping control section 830 includes a fifth NAND gate ND51 and a second NOR gate NOR51. The fifth NAND gate ND51 receives the second oscillator signal OSC_2 and the active signal ACT. The second NOR gate NOR51 receives the output signal of the fifth NAND gate ND51 and the second pumping enable signal REF_VBBEN and outputs the second active oscillator signal OSC_ACT2.

The second standby pumping section 840 is configured to perform a pumping operation in response to the second oscillator signal OSC_2 and generate the second pumping voltage VBB.

The second active pumping section 850 is configured to perform a pumping operation in response to the second active oscillator signal OSC_ACT2 and generate the second pumping voltage VBB. The output terminals of the second standby pumping section 840 and the second active pumping section 850 are commonly connected with each other at a node, and the voltage of the commonly connected node is the second pumping voltage VBB.

The first and second pumping voltage generation units 700 and 800 shown in FIGS. 9 and 10 represent embodiments in which the first and second standby pumping sections 740 and 840 are separated from the first and second active pumping sections 750 and 850. In the semiconductor apparatus including the first and second pumping voltage generation units 700 and 800 configured as shown in FIGS. 9 and 10, the first and second standby pumping sections 740 and 840 perform pumping operations regardless of the state active signal ACT. Also, the first and second active pumping sections 750 and 850 alternately perform pumping operations according to the first and second pumping enable signals REF_VPPEN and REF_VBBEN which are alternately enabled according to the active signal ACT. The first and second pumping voltage generation units 700 and 800 may be configured such that the pump number of the first and second active pumping sections 750 and 850 is larger than the pump number of the first and second standby pumping sections 740 and 840. Therefore, in the present embodiment of the invention, because the pumping operations of the first and second active pumping sections 750 and 850 which operate according to the active signal ACT are alternately performed, current consumed to generate the first and second pumping voltages VPP and VBB may be reduced and the peak current may be decreased.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a control unit configured to generate a first pumping enable signal and a second pumping enable signal which are alternately enabled, in response to an active signal;
   a first pumping voltage generation unit configured to perform a pumping operation during an enable period of the first pumping enable signal and generate a first pumping voltage; and
   a second pumping voltage generation unit configured to perform a pumping operation during an enable period of the second pumping enable signal and generate a second pumping voltage,
   wherein the control unit generates the first pumping enable signal which is repeatedly enabled and disabled at times when the active signal is enabled, and generates the second pumping enable signal which has a phase opposite to the first pumping enable signal.

2. The semiconductor apparatus according to claim 1, wherein the first pumping voltage has a voltage level higher than a level of an external voltage, and the second pumping voltage has a voltage level lower than a level of a ground voltage.

3. The semiconductor apparatus according to claim 1, wherein the control unit generates the first pumping enable signal by dividing the active signal, and generates the second pumping enable signal by inverting the first pumping enable signal.

4. The semiconductor apparatus according to claim 1, further comprising:
   a word line driver configured to be applied with the first pumping voltage and the second pumping voltage as driving voltages.

5. A semiconductor apparatus comprising:
   a first sensing section configured to sense a level of a first pumping voltage and generate a first oscillator enable signal;
   a first oscillator configured to generate a first oscillator signal in response to the first oscillator enable signal;
   a first standby pumping section configured to perform a pumping operation in response to the first oscillator signal and generate the first pumping voltage;
   a control unit configured to generate a first pumping enable signal and a second pumping enable signal which are alternately enabled, in response to an active signal;
   a first pumping control section configured to output the first oscillator signal as a first active oscillator signal during an enable period of the first pumping enable signal;
   a first active pumping section configured to perform a pumping operation in response to the first active oscillator signal and generate the first pumping voltage;

a second sensing section configured to sense a level of a second pumping voltage and generate a second oscillator enable signal;

a second oscillator configured to generate a second oscillator signal in response to the second oscillator enable signal;

a second standby pumping section configured to perform a pumping operation in response to the second oscillator signal and generate the second pumping voltage;

a second pumping control section configured to output the second oscillator signal as a second active oscillator signal during an enable period of the second pumping enable signal; and a second active pumping section configured to perform a pumping operation in response to the second active oscillator signal and generate the second pumping voltage.

6. The semiconductor apparatus according to claim 5, wherein the first pumping voltage has a voltage level higher than a level of an external voltage, and the second pumping voltage has a voltage level lower than a level of a ground voltage.

7. The semiconductor apparatus according to claim 5, wherein the control unit generates the first pumping enable signal which is repeatedly enabled and disabled at times when the active signal is enabled, and generates the second pumping enable signal which has a phase opposite to the first pumping enable signal.

8. A semiconductor apparatus comprising:
a control unit configured to generate a first pumping enable signal and a second pumping enable signal which are alternately enabled, in response to an active signal in a refresh operation;

a first pumping voltage generation unit configured to perform a pumping operation in response to the active signal and the first pumping enable signal and generate a first pumping voltage; and a second pumping voltage generation unit configured to perform a pumping operation in response to the active signal and the second pumping enable signal and generate a second pumping voltage, wherein the control unit generates the first pumping enable signal by dividing the active signal during an enable period of a refresh signal, and generates the second pumping enable signal by inverting the first pumping enable signal.

9. The semiconductor apparatus according to claim 8, wherein the first pumping voltage and the second pumping voltage have different levels.

10. The semiconductor apparatus according to claim 9, wherein the first pumping voltage has a voltage level higher than a level of an external voltage, and the second pumping voltage has a voltage level lower than a level of a ground voltage.

11. The semiconductor apparatus according to claim 8, wherein the control unit enables both the first and second pumping enable signals when the refresh signal is disabled.

12. The semiconductor apparatus according to claim 11, wherein the first pumping voltage generation unit performs the pumping operation when both the active signal and the first pumping enable signal are enabled.

13. The semiconductor apparatus according to claim 11, wherein the second pumping voltage generation unit performs the pumping operation when both the active signal and the second pumping enable signal are enabled.

14. A semiconductor apparatus comprising:
a control unit configured to generate a first pumping enable signal and a second pumping enable signal which are alternately enabled, in response to an active signal in a refresh operation;

a first pumping voltage generation unit configured to perform a pumping operation in response to the active signal and the first pumping enable signal and generate a first pumping voltage; and a second pumping voltage generation unit configured to perform a pumping operation in response to the active signal and the second pumping enable signal and generate a second pumping voltage, wherein, in the refresh operation, the first pumping voltage generation unit and the second pumping voltage generation unit alternately perform the pumping operations, and wherein, in a non-refresh operation, the first pumping voltage generation unit and the second pumping voltage generation unit simultaneously perform the pumping operations.

15. The semiconductor apparatus according to claim 14, wherein, when the refresh signal is enabled, the control unit alternately enables the first and second pumping enable signals at times when the active signal is enabled, and wherein, when the refresh signal is disabled, the control unit enables both the first and second pumping enable signals.

16. The semiconductor apparatus according to claim 15, wherein the first pumping voltage generation unit performs the pumping operation when both the active signal and the first pumping enable signal are enabled, and generates the first pumping voltage.

17. The semiconductor apparatus according to claim 15, wherein the second pumping voltage generation unit performs the pumping operation when both the active signal and the second pumping enable signal are enabled, and generates the second pumping voltage.

18. A semiconductor apparatus comprising:
a first sensing section configured to sense a level of a first pumping voltage and generate a first oscillator enable signal;

a first oscillator configured to generate a first oscillator signal in response to the first oscillator enable signal;

a first standby pumping section configured to perform a pumping operation in response to the first oscillator signal and generate the first pumping voltage;

a control unit configured to generate a first pumping enable signal and a second pumping enable signal which are alternately enabled, in response to an active signal in a refresh operation;

a first pumping control section configured to output the first oscillator signal as a first active oscillator signal when both the first pumping enable signal and the active signal are enabled;

a first active pumping section configured to perform a pumping operation in response to the first active oscillator signal and generate the first pumping voltage;

a second sensing section configured to sense a level of a second pumping voltage and generate a second oscillator enable signal;

a second oscillator configured to generate a second oscillator signal in response to the second oscillator enable signal;

a second standby pumping section configured to perform a pumping operation in response to the second oscillator signal and generate the second pumping voltage;

a second pumping control section configured to output the second oscillator signal as a second active oscillator signal when both the second pumping enable signal and the active signal are enabled; and a second active pumping section configured to perform a pumping operation in response to the second active oscillator signal and generate the second pumping voltage.

19. The semiconductor apparatus according to claim 18, wherein, when the refresh signal is enabled, the control unit alternately enables the first and second pumping enable signals at times when the active signal is enabled, and wherein, when the refresh signal is disabled, the control unit enables both the first and second pumping enable signals.

* * * * *